(12) United States Patent
Craven et al.

(10) Patent No.: US 8,809,867 B2
(45) Date of Patent: Aug. 19, 2014

(54) DISLOCATION REDUCTION IN NON-POLAR III-NITRIDE THIN FILMS

(75) Inventors: Michael D. Craven, San Jose, CA (US); Steven P. Denbaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 25 days.

(21) Appl. No.: 11/852,908

(22) Filed: Sep. 10, 2007

(65) Prior Publication Data

US 2008/0135853 A1     Jun. 12, 2008

Related U.S. Application Data

(60) Continuation-in-part of application No. 11/472,033, filed on Jun. 21, 2006, now Pat. No. 7,982,208, which is a division of application No. 10/413,690, filed on Apr. 15, 2003, now Pat. No. 7,091,514.

(60) Provisional application No. 60/372,909, filed on Apr. 15, 2002.

(51) Int. Cl.
    *H01L 29/15*      (2006.01)
    *H01L 21/20*      (2006.01)
    *H01L 21/02*      (2006.01)

(52) U.S. Cl.
CPC ........ *H01L 21/0237* (2013.01); *H01L 21/0242* (2013.01); *H01L 21/02609* (2013.01)
USPC .................. 257/76; 257/11; 257/12; 257/14; 257/E21.09; 438/507; 438/48; 438/22

(58) Field of Classification Search
CPC ................ H01J 1/34; H01J 2201/3432; H01L 21/02458; H01L 21/0254; H01L 33/22; H01L 33/06; H01L 33/32; H01L 29/127; H01L 21/02381; H01L 21/0237; H01L 21/0242; H01L 21/02609
USPC ............ 257/11, 14, 19, 347, 76, 13, E29.072, 257/E21.09, 12; 438/507, 48, 22
See application file for complete search history.

(56) References Cited

U.S. PATENT DOCUMENTS

| 4,939,557 A | * | 7/1990 | Pao et al. | 257/284 |
| 5,290,393 A | | 3/1994 | Nakamura | |

(Continued)

FOREIGN PATENT DOCUMENTS

| EP | 0 942 459 | 4/1998 |
| EP | 0942459 | 9/1999 |

(Continued)

OTHER PUBLICATIONS

Ambacher, O. et al., "Two-dimensional electron gases induced by spontaneous and piezoelectric polarization charges in N- and Ga-face AlGaN/GaN heterostructures," J. Appl. Phys., 1999, pp. 3222-3233, vol. 85, No. 6.

(Continued)

*Primary Examiner* — Thinh T Nguyen
(74) *Attorney, Agent, or Firm* — Gates & Cooper LLP

(57) ABSTRACT

Lateral epitaxial overgrowth of non-polar III-nitride seed layers reduces threading dislocations in the non-polar III-nitride thin films. First, a thin patterned dielectric mask is applied to the seed layer. Second, a selective epitaxial regrowth is performed to achieve a lateral overgrowth based on the patterned mask. Upon regrowth, the non-polar III-nitride films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

12 Claims, 5 Drawing Sheets

(56) References Cited

U.S. PATENT DOCUMENTS

| | | | |
|---|---|---|---|
| 5,432,808 A | 7/1995 | Hatano et al. | |
| 5,468,678 A | 11/1995 | Nakamura et al. | |
| 5,725,674 A | 3/1998 | Moustakas et al. | |
| 5,727,008 A | 3/1998 | Koga | |
| 5,777,350 A | 7/1998 | Nakamura et al. | |
| 5,784,187 A * | 7/1998 | Cunningham et al. | 359/248 |
| 5,793,054 A | 8/1998 | Nido | |
| 5,923,950 A | 7/1999 | Ishibashi et al. | |
| 5,926,726 A | 7/1999 | Bour et al. | |
| 6,045,626 A | 4/2000 | Yano et al. | |
| 6,051,849 A | 4/2000 | Davis et al. | |
| 6,064,078 A | 5/2000 | Northrup et al. | |
| 6,069,021 A | 5/2000 | Terashima et al. | |
| 6,072,197 A | 6/2000 | Horino et al. | |
| 6,086,673 A | 7/2000 | Molnar | |
| 6,153,010 A * | 11/2000 | Kiyoku et al. | 117/95 |
| 6,156,581 A | 12/2000 | Vaudo et al. | |
| 6,177,057 B1 | 1/2001 | Purdy | |
| 6,177,292 B1 | 1/2001 | Hong et al. | |
| 6,180,270 B1 | 1/2001 | Cole et al. | |
| 6,201,262 B1 | 3/2001 | Edmond et al. | |
| 6,218,280 B1 | 4/2001 | Kryliouk et al. | |
| 6,229,151 B1 | 5/2001 | Takeuchi et al. | |
| 6,259,122 B1 | 7/2001 | Ota et al. | |
| 6,265,089 B1 | 7/2001 | Fatemi et al. | |
| 6,268,621 B1 | 7/2001 | Emmi et al. | |
| 6,271,104 B1 | 8/2001 | Razeghi et al. | |
| 6,298,079 B1 | 10/2001 | Tanaka et al. | |
| 6,316,785 B1 | 11/2001 | Nunoue et al. | |
| 6,350,666 B2 | 2/2002 | Kryliouk | |
| 6,398,867 B1 | 6/2002 | D'Evelyn et al. | |
| 6,413,627 B1 | 7/2002 | Motoki et al. | |
| 6,440,823 B1 | 8/2002 | Vaudo et al. | |
| 6,441,391 B1 | 8/2002 | Ohno et al. | |
| 6,447,604 B1 | 9/2002 | Flynn et al. | |
| 6,468,882 B2 | 10/2002 | Motoki et al. | |
| 6,515,313 B1 * | 2/2003 | Ibbetson et al. | 257/103 |
| 6,566,218 B2 | 5/2003 | Otani et al. | |
| 6,569,704 B1 | 5/2003 | Takeuchi et al. | |
| 6,580,736 B1 | 6/2003 | Yoshie et al. | |
| 6,582,986 B2 | 6/2003 | Kong et al. | |
| 6,586,316 B2 | 7/2003 | Tsuda et al. | |
| 6,586,819 B2 * | 7/2003 | Matsuoka | 257/628 |
| 6,590,336 B1 | 7/2003 | Kadota | |
| 6,599,362 B2 | 7/2003 | Ashby et al. | |
| 6,602,763 B2 | 8/2003 | Davis et al. | |
| 6,623,560 B2 | 9/2003 | Biwa et al. | |
| 6,627,552 B1 | 9/2003 | Nishio et al. | |
| 6,635,901 B2 | 10/2003 | Sawaki et al. | |
| 6,645,295 B1 | 11/2003 | Koike et al. | |
| 6,653,663 B2 * | 11/2003 | Ishida | 257/103 |
| 6,656,615 B2 | 12/2003 | Dwilinski et al. | |
| 6,773,504 B2 | 8/2004 | Motoki et al. | |
| 6,847,057 B1 | 1/2005 | Gardner et al. | |
| 6,849,472 B2 | 2/2005 | Krames et al. | |
| 6,870,191 B2 | 3/2005 | Niki et al. | |
| 6,873,634 B2 | 3/2005 | Onomura et al. | |
| 6,882,051 B2 | 4/2005 | Majumdar et al. | |
| 6,900,070 B2 | 5/2005 | Craven et al. | |
| 6,951,695 B2 | 10/2005 | Xu et al. | |
| 6,958,093 B2 | 10/2005 | Vaudo et al. | |
| 6,969,426 B1 | 11/2005 | Bliss et al. | |
| 6,977,953 B2 | 12/2005 | Hata et al. | |
| 6,996,147 B2 | 2/2006 | Majumdar et al. | |
| 7,033,858 B2 * | 4/2006 | Chai et al. | 438/106 |
| 7,057,211 B2 * | 6/2006 | Dwilinski et al. | 257/97 |
| 7,078,731 B2 | 7/2006 | D'Evelyn et al. | |
| 7,091,514 B2 * | 8/2006 | Craven et al. | 257/14 |
| 7,132,730 B2 | 11/2006 | Dwilinski et al. | |
| 7,170,095 B2 | 1/2007 | Vaudo et al. | |
| 7,186,302 B2 | 3/2007 | Chakraborty et al. | |
| 7,208,096 B2 | 4/2007 | Akkipeddi et al. | |
| 7,220,658 B2 * | 5/2007 | Haskell et al. | 438/481 |
| 7,303,632 B2 | 12/2007 | Negley | |
| 7,368,015 B2 | 5/2008 | D'Evelyn et al. | |
| 2001/0011935 A1 | 8/2001 | Lee et al. | |
| 2001/0029086 A1 | 10/2001 | Ogawa et al. | |
| 2002/0005593 A1 | 1/2002 | Bourret-Courchesne | |
| 2002/0011935 A1 | 1/2002 | Kim | |
| 2002/0015866 A1 | 2/2002 | Hooper et al. | |
| 2002/0020341 A1 | 2/2002 | Marchand et al. | |
| 2002/0027933 A1 | 3/2002 | Tanabe et al. | |
| 2002/0039374 A1 | 4/2002 | Onomura et al. | |
| 2002/0047113 A1 | 4/2002 | Ohno et al. | |
| 2002/0069817 A1 | 6/2002 | Mishra et al. | |
| 2002/0074552 A1 | 6/2002 | Weeks et al. | |
| 2002/0098641 A1 | 7/2002 | Tsuda et al. | |
| 2002/0144645 A1 | 10/2002 | Kim et al. | |
| 2002/0187356 A1 | 12/2002 | Weeks et al. | |
| 2003/0020079 A1 | 1/2003 | Hata et al. | |
| 2003/0024475 A1 | 2/2003 | Anderson et al. | |
| 2003/0114017 A1 | 6/2003 | Wong et al. | |
| 2003/0127041 A1 * | 7/2003 | Xu et al. | 117/2 |
| 2003/0198837 A1 | 10/2003 | Craven et al. | |
| 2003/0213964 A1 | 11/2003 | Flynn et al. | |
| 2004/0094773 A1 | 5/2004 | Kiyoku et al. | |
| 2004/0108513 A1 | 6/2004 | Narukawa et al. | |
| 2004/0135222 A1 | 7/2004 | Alfano et al. | |
| 2004/0245535 A1 * | 12/2004 | D'Evelyn et al. | 257/94 |
| 2004/0251471 A1 | 12/2004 | Dwilinski et al. | |
| 2004/0261692 A1 * | 12/2004 | Dwilinski et al. | 117/84 |
| 2005/0142391 A1 | 6/2005 | Dmitriev et al. | |
| 2005/0161697 A1 | 7/2005 | Nakahata et al. | |
| 2005/0205884 A1 | 9/2005 | Kim et al. | |
| 2005/0214992 A1 | 9/2005 | Chakraborty et al. | |
| 2005/0245095 A1 | 11/2005 | Haskell et al. | |
| 2005/0258451 A1 | 11/2005 | Saxler et al. | |
| 2006/0043396 A1 | 3/2006 | Tsuda et al. | |
| 2006/0138431 A1 | 6/2006 | Dwilinski et al. | |
| 2009/0146160 A1 | 6/2009 | Nakahara | |
| 2009/0289330 A1 * | 11/2009 | Shibata | 257/615 |

FOREIGN PATENT DOCUMENTS

| | | |
|---|---|---|
| EP | 1335434 | 8/2003 |
| EP | 1385196 | 1/2004 |
| JP | 03-003233 | 9/1991 |
| JP | 05-183189 | 7/1993 |
| JP | 09-116225 | 5/1997 |
| JP | 10-135576 | 5/1998 |
| JP | 10135576 | 5/1998 |
| JP | 10-312971 | 11/1998 |
| JP | 11-191657 | 7/1999 |
| JP | 11-261169 | 9/1999 |
| JP | 11-297630 | 10/1999 |
| JP | 11-346002 | 12/1999 |
| JP | 11340580 | 12/1999 |
| JP | 2000-068609 | 3/2000 |
| JP | 2000-216497 | 8/2000 |
| JP | 2000277855 | 10/2000 |
| JP | 2001-007394 | 1/2001 |
| JP | 2001007396 | 1/2001 |
| JP | 2001024221 | 1/2001 |
| JP | 2001-160656 | 6/2001 |
| JP | 2001 257166 | 9/2001 |
| JP | 2001-298215 | 10/2001 |
| JP | 2001 342100 | 11/2001 |
| JP | 2002 076329 | 3/2002 |
| JP | 2002 076521 | 3/2002 |
| JP | 2002-94113 | 3/2002 |
| JP | 2002-100838 | 4/2002 |
| JP | 2002-111134 | 4/2002 |
| JP | 2003-060298 | 2/2003 |
| JP | 2003-060319 | 2/2003 |
| JP | 2003-124573 | 4/2003 |
| JP | 2006-310403 | 11/2006 |
| KR | 100992960 | 11/2010 |
| WO | 03-035945 | 5/2003 |
| WO | 03/089694 | 10/2003 |
| WO | 2004/061909 | 7/2004 |

(56) References Cited

FOREIGN PATENT DOCUMENTS

WO  2004/061969  7/2004
WO  2005/064643  7/2005

OTHER PUBLICATIONS

Craven, M.D. et al., "Structural characterization of nonpolar (1120) a-plane GaN thin films grown on (1102) r-plane sapphire," Appl. Phys. Letters, 2002, pp. 469-471, vol. 81, No. 3.
Freitas, J.A. et al., "Optical characterization of lateral epitaxial overgrown GaN layers," Appl. Phys. Letters, 1998, pp. 2990-2992, vol. 72, No. 23.
Kapolnek, D. et al., "Anisotropic epitaxial lateral growth in GaN selective area epitaxy," Appl. Phys. Letters, 1997, pp. 1204-1206, vol. 71, No. 9.
Langer, R. et al., "Giant electric fields in unstrained GaN single quantum wells," Appl. Phys. Letters, 1999, pp. 3827-3829, vol. 74, No. 25.
Lefebvre, P. et al., "High internal electric field in a graded-width inGaN/GaN quantum well: Accurate determination by time-resolved photoluminescence spectroscopy," Appl. Phys. Letters, 2001, pp. 1252-1254, vol. 78, No. 9.
Lefebvre, P. et al., "Time-resolved photoluminescence as a probe of internal electric fields in GaN-(GaAl)N quantum wells," Physical Review B, 1999, pp. 15 363-15 367, vol. 59, No. 23.
Marchand, H. et al., "Atomic force microscopy observation of threading dislocation density reduction in lateral epitaxial overgrowth of gallium nitride by MOCVD," MRS Internet Journal Nitride Semiconductor Research 3, 1998, pp. 1-7.
Marchand, H. et al., "Microstructure of GaN laterally overgrown by metalorganic chemical vapor deposition," Appl. Phys. Letters, 1998, pp. 747-749, vol. 73, No. 6.
Nakamura, S. et al., "Violet InGaN/GaN/AIGaN-Based Laser Diodes Operable at 50 C with a Fundamental Transverse Mode," Jpn. J. Appl. Phys., 1999, pp. L226-L229, Part 2, vol. 38, No. 3A.
Ok-Hyun, N. et al., "Lateral epitaxy of low defect density GaN layers via organometallic vapor phase epitaxy," Appl. Phys. Letters, 1997, pp. 2638-2640, vol. 71, No. 18.
Park, J. et al., "Selective-area and lateral epitaxial overgrowth of III-N materials by metal organic chemical vapor deposition," Appl. Phys. Letters, 1998, pp. 333-335, vol. 73, No. 3.
Rosner, S.J. et al., "Cathodoluminescence mapping of epitaxial lateral overgrowth in gallium nitride," Appl. Phys. Letters, 1999, pp. 2035-2037, vol. 74, No. 14.
Seo, I.J. et al., "Reduction of oscillator strength due to piezoelectric fields in GaN/AlxGa1-xN quantum wells," Physical Review B, 1998, pp. R9435-R9438, vol. 57, No. 16.
Smorchkova, I.P. et al., "Polarization-induced charge and electron mobility in AIGaN/GaN heterostructures grown by plasma-assisted molecular-beam epitaxy," J. Appl. Phys., 1999, pp. 4520-4526, vol. 86, No. 8.
Takeuchi, T. et al., "Determination of piezoelectric fields in strained GaInN quantum wells using the quantum-confined Stark effect," Appl. Phys. Letters, 1998, pp. 1691-vol. 73, No. 12.
Yu, Z. et al., "Epitaxial Lateral Overgrowth of GaN on SiC and Sapphire Substrates," MRS Internet J. Nitride Semicond. Res. 4S1, G4.3, 1999, 6 pgs.
Zheleva, T.S. et al., "Dislocation density reduction via lateral epitaxy in selectively grown GaN structures," Appl. Phys. Letters, 1997, pp. 2472-2474, vol. 71, No. 17.
Zheleva, T.S. et al., "Pendo-Epitaxy—A New Approach for Lateral Growth of Gallium Nitride Structures," MRS Internet J. of Nitride Semiconductor Res. 4S1, 1999, 6 pgs.
Shao, Y-P. et al., "Electrical Characterization of Semipolar Gallium Nitride Thin Films," NNIN REU Research Accomplishments, Aug. 2005, pp. 132-133.
Ajoul et al., "Hydrogen and Nitrogen Ambient Effects on Epitaxial Growth of GaN by Hydride Vapour Phase Epitaxy," Journal of Crystal Growth 230 (2001), pp. 372-376.

Amano, H., et. al., "Metalorganic vapor phase epitaxial growth of a high quality GaN film using an AlN buffer layer" Appl. Phys. Lett. 48 (5), Feb. 3, 1986, pp. 353-355.
Amano, H. et al., "Stress and Defect Control in GaN Using Low Temperature Interlayers," Jpn. J. Appl. Phys. vol. 37 (1998), pp. L1540-L 1542.
Bernardini et al., "Spontaneous polarization and piezoelectric constants of III-V nitrides," Phys. Rev. B 56, R10024 (1997).
Bhattacharyya et al., "Comparative study of GaN/AlGaN MQWs grown homoepitaxially on (1 1 0 0) and (0001) GaN," Crystal Growth 251, 487 (2003).
Bigenwald et al., "Confined excitons in GaN-AlGaN quantum wells," Phys. Stat. Sol. (b) 216, 371 (1999).
Bottcher, T., et al., "The role of high-temperature island coalescence in the development of stresses in GaN films" Appl. Phys. Lett. 78 (14), Apr. 2, 2001, pp. 1976-1978.
Brandt, O., et al., "Determination of strain state and composition of highly mismatched group-III nitride heterostructures by x-ray diffraction" J. Phys. D. Appl. Phys. 35 (2002), pp. 577-585.
Chakroborty et al., "Demonstration of nonpolar $m$-plane InGaN/GaN light-emitting diodes on free-standing $m$-plane GaN substrates," Japan J. Appl. Phys. 2005, vol. 44(5), pp. L173-L175.
Chakroborty et al., "Nonpolar InGaN/GaN emitters on reduced-defect lateral epitaxially overgrown a-plane GaN with drive-current-independent electroluminescence emission peak", Applied Physics Letters, vol. 85 No. 22, (Nov. 29, 2004).
Chen et al., "A new selective area lateral epitaxy approach for depositing $a$-plane GaN over $r$-plane sapphire," Japan J. Appl. Phys. 2003, vol. 42 (part. 2, No. 7B), pp. L818-L820.
Chitnis et al., "Visible light-emitting diodes using a-plane GaN-InGaN multiple quantum wells over r-plane sapphire", Applied Physics Letters, vol. 84 No. 18 (May 3, 2004).
Craven, M. D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.
Craven, M.D., et al., "Threading dislocation reduction via laterally overgrown nonpolar (1120) a-plane GaN" Appl. Phys. Lett. 81 (7), Aug. 12, 2002, pp. 1201-1203.
Dovidenko, K., et. al., Characteristics of stacking faults in AlN thin films J. Appl. Phys. 82 (9), Nov. 1, 1997, pp. 4296-4299.
Dupuis, R. D., et al., "Selective-area and lateral epitaxial overgrowth of III-N materials by metalorganic chemical vapor deposition" J. Crystal Growh, vol. 195, No. 1-4, Dec. 15, 1998, pp. 340-345.
Eastman, L. F., "The Toughest Transistor Yet" IEEE Spectrum 39 (5), May 2002, pp. 28-33.
Eddy, C. R., Jr., "Growth of gallium nitride thins films by electron cyclotron resonance microwave plasma-assisted molecular beam epitaxy" J. Appl. Phys. 73 (1), Jan. 1, 1993, pp. 448-455.
Etzkorn, E. V., et al., "Cracking of GaN films" J. Appl. Phys. 89 (2), Jan. 15, 2001, pp. 1025-1034.
Funato et al., "Blue, green and amber InGaN/GaN light-emitting diodes on semipolar {11-22} GaN bulk substrates," Jap. Journal Appl. Phys., vol. 45, No. 26 (2006), pp. L659-L662 (abstract only).
Gardner et al., "Polarization anisotropy in the electroluminescence of m-plane InGaN-GaN multiple-quantum-well light-emitting diodes," Applied Physics Letters 86, 111101 (2005).
Gehrke et al., "Pendeo-epitaxy of gallium nitride and aluminum nitride films and heterostructure on silicon carbide substrate," MRS Internet J. Semicond. Res. 4S1, G3.2, 1999, 6 pp.
Ghandhi, "VLSI fabrication principles: silicon and gallium arsenide," $2^{nd}$ Edition, Wiley-Interscience, 1994, pp. 639-642.
Grandjean, N., et al., "Built-in electric-field effects in wurtzite AlGaN quantum wells" J. Appl. Phys. 86 (7), Oct. 1, 1999, pp. 3714-3720.
Grandjean et al., "Self-limitation of AlGaN/GaN quantum well energy by built-in polarization field," Applied Physics Letters, vol. 74, No. 16 (Apr. 19, 1999).
Grzegory, et al., "Seeded growth of GaN at high $N_2$ pressure on (0 0 0 1) polar surfaces of GaN single crystalline substrates," Materials Science in Semiconductor Processing, vol. 4, No. 6, Dec. 2001, pp. 535-541.

(56) References Cited

OTHER PUBLICATIONS

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Haskell et al., "Defect reduction in (1120) a-plane gallium nitride via lateral epitaxial overgrowth by hydride vapor-phase epitaxy," Applied Physics Letters, vol. 83 No. 4 (Jul. 28, 2003).

Heying, B., et al., "Role of threading dislocation structure on the x-ray diffraction peak widths in epitaxial GaN films" Appl. Phys. Lett. 68 (5), Jan. 29, 1996, pp. 643-645.

Im, J.S., et. al., "Reduction of oscillator strength due to piezoelectric fields in GaN/Al$_x$Ga$_{1-x}$N quantum wells" Phys. Rev. B. 57 (16), Apr. 15, 1998-II, pp. R9435-R9438.

Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L 661-L664.

Iwaya et al., "Reduction of etch pit density in organometallic vapor phase epitaxy-grown GaN on sapphire by insertion of a low-temperature-deposited buffer layer between high-temperature-grown GaN," Jpn. J. Appl. Phys., 1998, 37: L316-L318.

Keller et al., "Metalorganic Chemical Vapor Deposition Growth of High Optical Quality and High Mobility GaN", J. Electronic Materials, vol. 24, pp. 1707-1709 (1995).

Keller et al., "Spiral growth of InGaN nanoscale islands on GaN," Jpn. J. Appl. Phys., 1998, 37: L431-L434.

Kinoshita et al., "Emission enhancement of GaN/AlGaN single-quantum-wells due to screening of piezoelectric field," MRS Internet J. Nitride Semicond. Res. 5, W11.32 (2000).

Kozodoy et al., "Electrical characterization of GaN p-n junctions with and without threading dislocations," Appl. Phys. Lett., 1998, 73(7): 975-977.

Kuokstis et al., "Polarization effects in photoluminescence of C- and M-plane GaN/AlGaN multiple quantum wells," Appl. Phys. Lett. 81, 4130 (2002).

"Kyma Technologies announces improved and expanded native gallium nitride product line," Mar. 20, 2006, Company News Releases, retrieved from http://www.compoundsemi.com/documents/articles/c1doc/6524.html.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leroux et al., "Quantum confined Stark effect due to built-in internal polarization fields in (Al,Ga)N/GaN quantum wells," Phys. Rev. B 58, R113371 (1998).

Leszczynski, M., et. al., "Lattice parameters of gallium nitride" Appl. Phys. Lett. 69 (1), Jul. 1, 1996, pp. 73-75.

Liu, L. et al., "Substrates for gallium nitride epitaxy", Materials Science and Engineering R, Reports: A Review Journal, vol. 37, No. 3, Apr. 30, 2002, pp. 61-127.

Marchand, H., et al., "Mechanisms of lateral epitaxial overgrowth of gallium nitride by metalorganic chemical vapor deposition" J. of Crystal Growth, vol. 195, No. 1-4, Dec. 15, 1998, pp. 328-332.

McMahan, "Dr. Shuji Nakamura and UCSB research team report first nonpolar and semi-polar GaN LEDs," Compoundsemi Online, Mar. 24, 2006, one page.

Metzger, T., et. al., "X-Ray Diffraction Study of Gallium Nitride Grown by MOCVD" Physica status solidi (b) 193, 1996, pp. 391-397.

Miller et al., "Electric field dependence of optical absorption near the band gap of quantum-well structures," The American Physical Society, Physical Review B, vol. 32, No. 2, Jul. 15, 1985.

Mills, A., "Wide-bandgap emitters continue to improve", III-Vs Review, vol. 13, No. 3, May 2000, pp. 23-24, 26, 28-30, XP004200697.

Moe et al., "Milliwatt power deep ultraviolet light emitting diodes grown on silicon carbide," Japan J. Appl. Phys. 2005, vol. 44(17), pp. L502-L504.

Moustakas, T. D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Mukai et al., "Ultraviolet InGaN and GaN single-quantum-well-structure light-emitting diodes grown on epitaxially laterally overgrown GaN substrates," Japan J. Appl. Phys., vol. 38, 1999, pp. 5735-5739.

Nakamura et al., The Blue Laser Diode, (Springer, Heidelberg, 1997), pp. 160-178.

Nakamura et al., "InGaN/GaN/AlGaN-based laser diodes with modulation-doped strained-layer superlattices grown on an epitaxially laterally overgrown GaN substrate," Appl. Phys. Lett., 1998, 72(2), pp. 211-213.

Nam, O., et. al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/Al$_2$O$_3$ patterned substrates by halide vapour-phase epitaxy" J. of Crystal Growth (192), Feb. 20, 1998, pp. 73-78.

Neubert, "Growth characteristics of GaInN quantum wells on semipolar GaN facets," Annual Report 2005, Optoelectronics Department, University of Ulm 2006, pp. 1-6.

Ng, H. M., "Molecular-beam epitaxy of GaN/Al$_x$Ga$_{1-x}$N multiple quantum wells on R-plane (1012) sapphire substrates" Appl. Phys. Lett. 80 (23), Jun. 10, 2002, pp. 4369-4371.

Nichizuka, K., "Efficient Radiative Recombination From <1122>-oriented In$_x$Ga$_{1-x}$N Multiple Quantum Wells Fabricated by the Regrowth Technique," Applied Physics Letters, Oct. 2004, vol. 85, No. 15, pp. 3122-3124, abstract.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Ohba et al, "A study on strong memory effect for Mg doping in GaN metalorganic chemical vapor deposition," J. Cryst. Growth, vol. 145, 1994, pp. 214-218.

Okamoto, K. et al., "Dislocation-Free m-Plane InGaN/GaN Light-Emitting Diodes on m-Plane GaN Single Crystals," Japanese Journal of Applied Physics, vol. 45, No. 45, 2006, pp. L1197-L1199.

Parish et al., "High-performance (Al, Ga) N-based solar-blind ultraviolet p-i-n detectors on laterally epitaxially overgrown GaN," Appl. Phys. Lett., 1990, 75(2), pp. 247-249.

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Pearton et al., "GaN: Processing, defects, and devices," Applied Physics Reviews, Journal of Applied Physics, vol. 86, No. 1, Jul. 1, 1999.

Sakai, A., et al., "Self-organized propagation of dislocations in GaN films during epitaxial lateral growth" Appl. Phys. Lett. 76 (4), Jan. 24, 2000, pp. 442-444.

Sasaki, T. et al, "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sano, M., et al., "Epitaxial Growth of Undoped and Mg-Doped GaN" Jpn. J. of Appl. Phys. 15 (10), Oct. 1976, pp. 1943-1950.

Sharma et al., "Demonstration of a semipolar (1013) InGaN/GaN green light emitting diode," Applied Physics Letters 87, 231110 (2005), pp. 1-3.

Shintani, A., et al. "Light Emitting Patterns of Gallium Nitride Electroluminescence" J. Electrochem. Soc. 123 (10), Oct. 1976, pp. 1575-1578.

Srikant et al., "Mosaic structure in epitaxial thin films having large lattice mismatch," J. Appl. Phys., 1997, 82(9): 4286-4295.

(56) References Cited

OTHER PUBLICATIONS

Sun, Chien-Jen et al., "Comparison of the physical properties of GaN thin films deposited on (0001) and (0112) sapphire substrates", Applied Physics Letters, vol. 63, No. 7, 1993, pp. 973-975, XP002251480.

Sun et al., "In surface segregation in M-plane (In,Ga)N/GaN multiple quantum well structures," Applied Physics Letters, vol. 83 No. 25 (Dec. 22, 2003).

Sun et al., "Nonpolar $In_xGa_{1-x}N/GaN(1100)$ multiple quantum wells grown on $\gamma$-$LiAlO_2(100)$ by plasma-assisted molecular-beam epitaxy," Physical Review B 67 (2003).

Takeuchi et al., "Theoretical study of orientation dependence of piezoelectric effects in wurtzite strained GaInN/GaN heterostructures and quantum wells," Jpn. J. Appl. Phys. vol. 39, pp. 413-416, Part 1, No. 2A (Feb. 2000).

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tanaka et al., "Anti-surfactant in III-nitride-epitaxy—quantum dot formation and dislocation termination," Jpn. J. Appl. Phys., 2000, 39: L831-L834.

Tanaka et al., "Self-assembling GaN quantum dots on $Al_xGa_{1-x}N$ surfaces using a surfactant," Appl. Phys. Lett., 1996, 69(26): 4096-4098.

Traetta et al., "Effects of the spontaneous polarization and piezoelectric fields on the luminescence spectra of $GaN/Al_{0.15}Ga_{0.85}N$ quantum wells", Physica E 7, 929-933 (2000).

Tsuchiya, H., et al., "Growth condition dependence of GaN crystal structure on (0 0 1)GaAs by hydride vapor-phase epitaxy" J. of Crystal Growth (189/190), 1998, pp. 395-400.

Usui et al., "Thick GaN epitaxial growth with low dislocation density by hydride vapor phase epitaxy," Jpn. J. Appl. Phys., 1997, 36: L899-L902.

Vanfleet et al., "Defects in m-face GaN films grown in halide vapor phase epitaxy on $LiAlO_2$", Applied Physics Letters, vol. 83 No. 6 (Aug. 11, 2003).

Waltereit, P., et. al., "Nitride semiconductors free of electrostatic fields for efficient white light-emitting diodes" Nature vol. 406, Aug. 24, 2000, pp. 865-868.

Waltereit et al., "M-Plane GaN(1 1 0 0) Grown on $\gamma$-$LiAlO_2$(1 0 0): Nitride Semiconductors Free of Internal Electrostatic Fields," Journal of Crystal Growth 227-228 (2001), pp. 437-441.

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Yu., Z., et. al., "Epitaxial lateral overgrowth of GaN on SiC and sapphire substrates" MRS Internet J. Nitride Semicond. Res. 4S1, G4.3 (1999).

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy—A new approach for lateral growth of gallium nitride structures" MRS Internet J. Nitride Semicond. Res. 4S1, G3.38 (1999).

Office Action mailed Jul. 2, 2007, U.S. Appl. No. 10/537,385, filed Jun. 3, 2005.

Office Action mailed Apr. 7, 2006, U.S. Appl. No. 10/537,644, filed Jun. 6, 2005.

Office Action mailed Aug. 14, 2007, U.S. Appl. No. 10/582,390, filed Jun. 9, 2006.

Office Action mailed May 29, 2008, U.S. Appl. No. 10/582,390, filed Jun. 9, 2006.

Office Action mailed Nov. 12, 2008, U.S. Appl. No. 10/582,390, filed Jun. 9, 2006.

Office Action mailed Jan. 18, 2006, U.S. Appl. No. 11/140,893, filed May 31, 2005.

Office Action mailed Jul. 14, 2006, U.S. Appl. No. 11/140,893, filed May 31, 2005.

Office Action mailed Jan. 3, 2007, U.S. Appl. No. 11/444,083, filed May 31, 2006.

Japanese Office Action mailed Apr. 1, 2009, Application No. 2003-586403, Filing Date Apr. 15, 2003.

Japanese Office Action mailed Apr. 1, 2009, Application No. 2003-586402, Filing Date Apr. 15, 2003.

Korean Office Action dated Aug. 9, 2011 (Application No. 10-2004-7016456) with translation.

Kim, et al., "Microstructure of GaN films on sapphire surfaces with various orientations", Journal of Korean Association of Crystal Growth, vol. 9, No. 2 (1999), pp. 162-167.

Lim, et al., "Theoretical Calculation of SAW Propagation of GaN/Sapphire Structure according to SAW Propagation Direction", Journal of the Korean Ceramic Society, vol. 40, No. 6 (2003), pp. 539-546.

European Office Action dated Aug. 23, 2011 (Application No. 03723982.9).

Korean Office Action dated Nov. 23, 2010 (KR Application No. 10-2010-7019520) with English translation.

Korean Office Action dated Jul. 28, 2011, Application No. 10-2010-7019520, with translation.

Korean Office Action dated Sep. 1, 2010 (Application 10-2004-7016456) with translation.

Hiramatsu, "Epitaxial lateral overgrowth techniques used in group III nitride epitaxy", Journal of Physics: Condensed Matter, published: Jul. 26, 2001.

Korean Office Action [Examination Result} 10-2004-7016456 (corresponds to U.S. Appl. No. 10/413,913).

Korean Office Action dated Sep. 1, 2010 (corresponds to U.S. Appl. No. 10/413,913).

EP Office Action dated Aug. 4, 2009 (corresponds to U.S. Appl. No. 10/413,913).

JP Office Action daetd Apr. 14, 2010 (corresponds to U.S. Appl. No. 10/413,913).

EP Application No. 03723982.9, Office Action dated Sep. 15, 2010.

Japanese Inquiry dated Jul. 1, 2011, Japanese Patent Application No. 2003-586402 (with translation).

KR Office Action dated Dec. 14, 2011, Application No. 10-2004-7016456.

KR Notice of Preliminary Rejection dated Feb. 15, 2012 with English translation (KR Application No. 10-2011-7028367).

European Office Action dated Jun. 7, 2013 for European Patent Application No. 03726251.6.

Japanese Office Action (with English translation) dated Jun. 12, 2013 for Japanese Patent Application No. 2009-181101.

Japanese Office Action dated Aug. 30, 2012, with English translation.

Japanese Office Action mailed Aug. 27, 2009, Application No. 2003-586401.

International Search Report, International application No. PCT/US03/11175, International filing date Apr. 15, 2003, mailed Aug. 26, 2003.

European Office Action dated Feb. 16, 2009, Application No. 03 719 669.5-1215.

Langer et al., "Giant electric fields in unstrained GaN single quantum wells," Appl. Phys. Lett. 74, 3827-3829 (1999).

Monemar et al., "Properties of Zn-doped VPE-grown GaN.I.Luminescence data in relation to doping conditions," J. Appl. Phys. 51 (1), Jan. 1980, pp. 625-639.

Ok-Hyun et al., "Violet InGaN/GaN/AlGaN-based laser diodes operable at 50 C with a fundamental transverse mode," Jpn. J. Appl. Phys., vol. 38, No. 3A, 1999, pp. L226-229, Part 2.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

(56) References Cited

OTHER PUBLICATIONS

Freitas, J. A., Jr., et al., "Optical characterization of lateral epitaxial overgrown GaN layers" Appl. Phys. Lett. 72 (23), Jun. 8, 1998, pp. 2990-2992.
Kapolnek, D., et al., "Anisotropic epitaxial lateral growth in GaN selective area epitaxy" Appl. Phys. Lett. 71 (9), Sep. 1, 1997, pp. 1204-1206.
Lefebvre, P., et al., "Time-resolved photoluminescence as a probe of internal electric fields in GaN-(GaAl)N quantum wells" Phys. Rev. B. 59 (23), Jun. 15, 1999-I, pp. 15363-15367.
Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.
Marchand, H., et al., "Microstructure of GaN laterally overgrown by metalorganic chemical vapor deposition" Appl. Phys. Lett.. 73 (6), Aug. 10, 1998, pp. 747-749.
Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.
Nakamura, S, et. al., "Violet InGaN/GaN/AlGaN-Based Laser Diodes Operable at 50° C. with a Fundamental Transverse Mode" Jpn. J. Appl. Phys. 38 (2), 1999, pp. L226-L229.
Park, J., et. al., "Selective-area and lateral epitaxial overgrowth of III-N materials by metal organic chemical vapor deposition" Appl. Phys. Lett. 73 (3), 20 Jul. 1998, pp. 333-335.
Rosner, S.J., et. al., "Cathodoluminescence mapping of epitaxial lateral overgrowth in gallium nitride" Appl. Phys. Lett. 74 (14), Apr. 5, 1999, pp. 2035-2037.
Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.
Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.
Craven, M.D. et al., "Structural characterization of nonpolar (1120) a-plane GaN thin films grown on (1102) r-plane sapphire", Applied Physics Letters, vol. 81, No. 3, Jul. 15, 2002, pp. 469-471, XP002250684.
Maruska, H.P. et al., "Development of 50 mm Diameter Non-Polar Gallium Nitride Substrates for Device Applications", International Conference on Indium Phosphide and Related Materials, May 16, 2003, pp. 567-570.
Korean Office Action (with English translation) for application No. 2004-7016454 dated Jul. 1, 2011.
Korean Office Action (with English translation) for application No. 2011-7010086 dated Jun. 30, 2011.
KR Office Action dated Jan. 31, 2011 (KR application No. 2004-7016454)—translation only.
JP Office Action dated Jan. 19, 2011 (JP application No. 2003-586401)—with translation.
KR Office Action dated Apr. 22, 2010 (KR application No. 2004-7016454)—translation only.
EP Application No. 03719699.5—Office action dated Sep. 16, 2010.
Chen, C. et al., "GaN homoepitaxy on freestanding (1100) oriented GaN substrates," Applied Physics Letters, vol. 81, No. 17, Oct. 21, 2002, 3194.
Chen, C. et al., "Ultraviolet light emitting diodes using non-polar a-plane GaN-AlGaN multiple quantum wells," Jpn. J. Appl. Phys., vol. 42, No. 9A/B, Sep. 15, 2003, pp. L1039-L1040.
Iwata et. al., Gas Source Molecular Beam Epitaxy Growth of GaN on C-, A-, R- and M-Plane Sapphire and Silica Glass Substrates, Japanese Journal of Applied Physics, Jun. 1, 1997, Part 2, vol. 36, No. 6A, pp. L661-L664.
Th. Metzger et. al., X-Ray Diffraction Study of Gallium Nitride Grown by MOCVD, Physica Status Solidi. B., Feb. 1996, vol. 193, No. 2, pp. 391-397.
Sun, W. et al., "Strong ultraviolet emission from non-polar AlGaN/GaN quantum wells grown over r-plane sapphire substrates," Phys. Stat. Sol. (a), vol. 200, No. 1, Nov. 2003, pp. 48-51.
Japanese Notice of Reasons for Rejection dated Mar. 27, 2009, Application No. 2003-586402.
Japanese Office Action dated Mar. 27, 2009, Application No. 2003-586403.
Japanese Office Action dated Aug. 20, 2009, Application No. 2003-586401.
Japanese Office Action dated Jul. 4, 2011, Application No. 2003-586403 (with translation).
Japanese Office Action dated Sep. 6, 2011, Application No. 2008-514783.
Japanese Office Action dated Jul. 3, 2012, Application No. 2009-181100.
Korean Office Action dated Feb. 19, 2010, Application No. 10-2004-7016456.
Korean Office Action dated Mar. 3, 2010, Application No. 10-2004-7016455.
Korean Office Action dated Nov. 23, 2010, Application No. 10-2010-7019520 (with translation).
Korean Office Action dated Jul. 11, 2012, Application No. 10-2004-7016454.
International Search Report dated Aug. 26, 2003, Application No. PCT/US03/11175.
International Search Report dated Aug. 26, 2003, Application No. PCT/US03/11176.
International Search Report dated Aug. 21, 2003, Application No. PCT/US03/11177.
EP Office Action dated Sep. 15, 2010, Application No. 03726251.6.
EP Office Action dated Sep. 12, 2011, Application No. 03790447.1.
Korean Notice of Re-examination Result Before Trial (with English translation) dated Feb. 4, 2014 for Korean Application No. 10-2011-7028367.
Japanese Office Action (with English translation) dated Mar. 13, 2014 for Japanese Patent Application No. 2010-250340.

\* cited by examiner

DISLOCATION REDUCTION IN NON-POLAR III-NITRIDE THIN FILMS

CROSS-REFERENCE TO RELATED APPLICATIONS

This application is a continuation-in-part of the following application:

U.S. Utility patent application Ser. No. 11/472,033, entitled "NON-POLAR (Al, B, In, Ga)N QUANTUM WELL AND HETEROSTRUCTURE MATERIALS AND DEVICES," filed on Jun. 21, 2006, by Michael D. Craven, Stacia Keller, Steven P. DenBaars, Tal Margalith, James S. Speck, Shuji Nakamura, and Umesh K. Mishra, now U.S. Pat. No. 7,982,208, issued Jul. 19, 2011, which application is a divisional application and claims the benefit under 35 U.S.C. §120 and §121 of U.S. Utility patent application Ser. No. 10/413,690, filed on Apr. 15, 2003, by Michael D. Craven et al., entitled "NON-POLAR (Al, B, In, Ga)N QUANTUM WELL AND HETEROSTRUCTURE MATERIALS AND DEVICES," now U.S. Pat. No. 7,091,514, issued Aug. 15, 2006, which claims the benefit under 35 U.S.C. §119(e) of U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. Denbaars, Tal Margalith, James S. Speck, Shuji Nakamura, and Umesh K. Mishra;

which application is incorporated by reference herein.

This application is related to the following co-pending application:

U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, which application claims the benefit under 35 U.S.C. §119(e) of U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. Denbaars, Tal Margalith, James S. Speck, Shuji Nakamura, and Umesh K. Mishra;

which application is incorporated by reference herein.

1. FIELD OF THE INVENTION

The invention is related to semiconductor materials, methods, and devices, and more particularly, to dislocation reduction in non-polar III-nitride thin films.

2. DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

Current nitride-based devices employ heterostructures grown along the polar [0001] c-direction, resulting in the formation of strong electrostatic fields parallel to the growth direction. See References 1-7. The "built-in" electrostatic fields are created by fixed sheet charges associated with polarization discontinuities at surfaces and interfaces within c-plane (0001) nitride structures.

These polarization-induced electric fields affect the performance of current state-of-the-art optoelectronic and electronic nitride devices. For example, the polarization fields spatially separate electron and hole wave functions in quantum well (QW) structures, thereby reducing carrier recombination efficiencies in QW-based devices such as laser diodes and light emitting diodes (LEDs). Additionally, the polarization fields induce large mobile sheet charge densities in transistor structures which employ nitride heterostructures. Discontinuities in total polarization result in the formation of fixed sheet charges at the corresponding interfaces or surfaces.

Epitaxial growth of non-polar wurtzite nitride semiconductor films provides a promising means of eliminating polarization-induced electric field effects in nitride quantum structures. In the related applications identified above, non-polar ($11\bar{2}0$) a-plane GaN films (referred to herein as a-GaN) have been grown on ($1\bar{1}02$) r-plane sapphire substrates via metalorganic chemical vapor deposition (MOCVD). See Reference 13. However, the threading dislocation density present in these films has been determined to be approximately $2.6\times 10^{10}$ cm$^{-2}$.

To fully realize the advantages of non-polar nitride layers, improvements in epitaxial film quality are necessary, and in particular reductions in dislocation density are necessary. Specifically, improving the crystal quality of these films is fundamental to the realization of high-performance nitride devices which operate free from polarization-induced electric fields.

Although a variety of techniques have been demonstrated, dislocation reduction has been extensively studied in laterally overgrown polar GaN films. See References 8-11. Low dislocation density substrates obtained through various lateral overgrowth techniques are directly responsible for the remarkable performance of nitride-based optoelectronics, and most notably, enhanced lifetime continuous wave InGaN laser diodes. See Reference 12.

Lateral overgrowth techniques are well known in the prior art. For example, lateral overgrowth techniques have been thoroughly studied for dislocation reduction of polar c-plane (0001) GaN films. Specific overgrowth techniques include lateral epitaxial overgrowth (LEO), which is also known as epitaxial lateral overgrowth (ELO or ELOG), and PENDEO® epitaxy. Despite the differences between these processes, dislocation reduction is achieved by common mechanisms, primarily mask blocking and dislocation bending. See References 11 and 19.

However, the present invention is a novel application of those methods for non-polar III-nitride films. Specifically, the present invention describes a LEO method using non-polar III-nitride seed layers that achieves threading dislocation reduction. Low dislocation density non-polar III-nitride films can be used as a buffer layer for high performance, polarization-induced field free (Al, B, In, Ga)N-based devices.

SUMMARY OF THE INVENTION

Lateral epitaxial overgrowth of non-polar III-nitride thin films reduces threading dislocations in the films. First, a thin patterned dielectric mask is applied to the seed layer. Second, a selective epitaxial regrowth is performed to achieve a lateral overgrowth based on the patterned mask. Upon regrowth, the films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

BRIEF DESCRIPTION OF THE DRAWINGS

Referring now to the drawings in which like reference numbers represent corresponding parts throughout:

FIGS. 5(a), (b) and (c) are plan-view panchromatic CL images of stripes oriented parallel to [0001], [$\bar{1}$101], and [$\bar{1}$100], while FIG. 5(d) illustrates the crystallographic orientation for FIGS. 5(a), (b) and (c).

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention reduces threading dislocation densities in non-polar III-nitride through the lateral overgrowth of a planar heteroepitaxial "seed" layer. Lateral overgrowth techniques require a processing step between two MOCVD growths, an initial heteroepitaxial growth and a regrowth that constitutes the lateral overgrowth. First, a thin patterned dielectric mask is applied to the seed layer. Upon regrowth, the III-nitride initially grows vertically through openings in the dielectric mask before laterally overgrowing the mask in directions perpendicular to the vertical growth direction. With the proper mask and regrowth conditions, dislocation densities are reduced in the laterally overgrown regions as compared to the regions that grow vertically through openings in the mask. Dislocations are reduced in the overgrown regions by (1) the mask blocking the propagation of dislocations vertically into the growing film and (2) the bending of dislocations through the transition from vertical to lateral growth.

Process Steps

Figure 1:
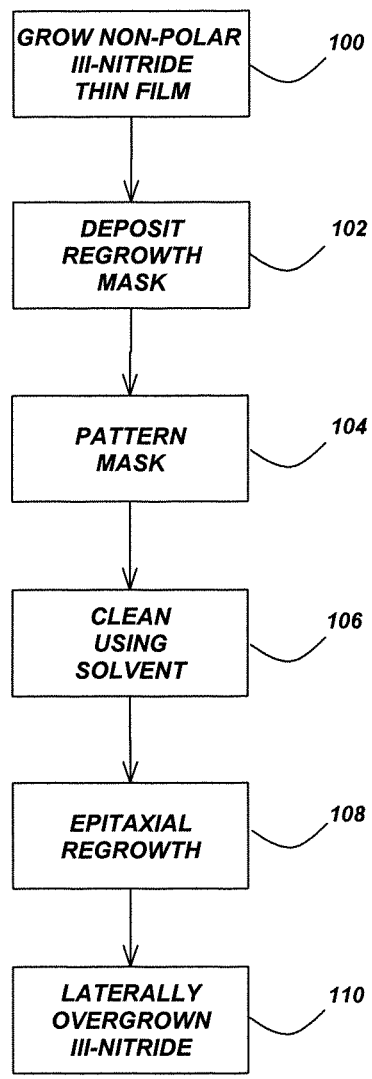
FIG. 1 is a flowchart that illustrates the steps for reducing threading dislocation densities in non-polar III-nitride through the lateral overgrowth of a planar heteroepitaxial "seed" layer, according to the preferred embodiment of the present invention.

FIG. 1 is a flowchart that illustrates the steps for reducing threading dislocation densities in non-polar III-nitride through the lateral overgrowth of a planar heteroepitaxial "seed" layer, according to the preferred embodiment of the present invention.

Block 100 represents growing a non-polar III-nitride thin film on a (1$\bar{1}$02) r-plane sapphire substrate via MOCVD, as described in U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, which application claims the benefit under 35 U.S.C. §119(e) of U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. Denbaars, Tal Margalith, James S. Speck, Shuji Nakamura, and Umesh K. Mishra, which applications are incorporated by reference herein. The heteroepitaxially-grown non-polar III-nitride thin film comprises a "seed layer" for the lateral overgrowth of the present invention.

Block 102 represents depositing a dielectric regrowth mask on the non-polar III-nitride thin film via plasma-enhanced chemical vapor deposition (PECVD). In the preferred embodiment, the mask is comprised of, but is not limited to, 200 nanometers (nm) of $SiO_2$.

Block 104 represents patterning the deposited mask, wherein the pattern is transferred to the SiO2 using conventional photolithographic techniques and wet etching with buffered hydrofluoric acid. Preferably, the deposited mask is patterned with long, narrow stripe openings oriented in a variety of crystallographic directions.

After patterning the mask, Block 106 represents cleaning the sample using solvents.

Block 108 represents performing a selective epitaxial regrowth to achieve the lateral overgrowth based on the patterned mask, wherein the III-nitride initially grows vertically through openings in the mask before laterally overgrowing the mask in directions perpendicular to a vertical growth direction. Dislocation densities are reduced in the laterally overgrown regions as compared to regions that grow vertically through openings in the mask. Moreover, dislocations are reduced in the overgrown regions by the mask blocking propagation of dislocations vertically into the growing film and by bending of dislocations through a transition from vertical to lateral growth.

Preferably, the III-nitride has a dislocation density of less than $2.6 \times 10^{10}$ $cm^{-2}$, and more preferably, the III-nitride has a dislocation density of less than $1 \times 10^8$ $cm^{-2}$. In addition, the III-nitride preferably has a stacking fault density less than $3.8 \times 10^5$ $cm^{-1}$.

Preferably, Block 108 uses the same reactor conditions employed for the heteroepitaxial growth on the sapphire substrate, i.e., ~1100° C. growth temperature, ~1300 V/III ratio, and ~0.1 atmospheric (atm) growth pressure, although modified conditions could be used.

Block 110 represents the resulting lateral overgrowth, wherein the lateral overgrowth comprises laterally overgrown III-nitride formed stripes, as determined by the underlying mask pattern. The overgrown stripe morphology is dependent on the crystallographic orientation of the mask stripe. For example, stripes aligned to [1$\bar{1}$00] have rectangular cross-sections and exhibit substantial dislocation reduction in the overgrown regions.

Potential devices that may be manufactured using this method include laser diodes (LDs), light emitting diodes (LEDs), resonant cavity LEDs (RC-LEDs), vertical cavity surface emitting lasers (VCSELs), high electron mobility transistors (HEMTs), heterojunction bipolar transistors (HBTs), heterojunction field effect transistors (HFETs), as well as UV and near-UV photodetectors.

Experimental Results

Experimental results found that lateral epitaxial overgrowth was successful in reducing the threading dislocation densities of non-polar (11$\bar{2}$0) a-plane GaN films. This section reports on the dependence of morphology and defect reduction on crystallographic stripe orientation.

Stripes aligned along [0001] and [$\bar{1}$100], the most favorable a-plane GaN LEO stripe orientations, possessed wellbehaved, symmetric morphologies. Threading dislocation reduction via mask blocking was observed by transmission electron microscopy (TEM) for [$\bar{1}$100] stripes that had optimal rectangular cross-sections. Cathodoluminescence (CL) studies showed increased light emission for the overgrown regions in comparison to the window regions. The extent of lateral overgrowth of these stripes was asymmetric due to the opposing polarities of the vertical c-plane sidewalls. Conversely, threading dislocations propagated into the symmetric overgrown regions of [0001] stripes which possessed coexisting inclined and vertical {10$\bar{1}$0} facets.

The stripe morphology was observed using a JEOL 6300™ field emission scanning electron microscope (FE-SEM) operating at 5 kV. The microstructure of the lateral overgrowth was studied in cross-section using a JEOL 2000FX™ transmission electron microscope (TEM) operating at 200 kV. Cathodoluminescence (CL) images were obtained at room temperature using a Gatan MonoCL™ attached to the JEOL 6300™ FE-SEM and provided spatial maps of the luminescence from the laterally overgrown stripes.

As has been shown for laterally overgrown c-plane GaN, the crystallographic orientation of the mask stripe openings dictate the facets that form and, hence, the characteristics of the lateral overgrowth. See Reference 14. To investigate the orientation dependence of the laterally overgrown a-GaN, the SiO2 mask was patterned with an array of rectangular mask openings (windows) which formed a "wagon wheel" design. The windows that made up the wagon wheel pattern were 5 μm wide and oriented in 5° intervals so that a range of crystallographic mask orientations could be analyzed in a single MOCVD growth run. This experimental design is similar to that employed for the initial investigations of laterally overgrown c-plane GaN from linear mask openings. See References 14 and 15.

Figure 2:
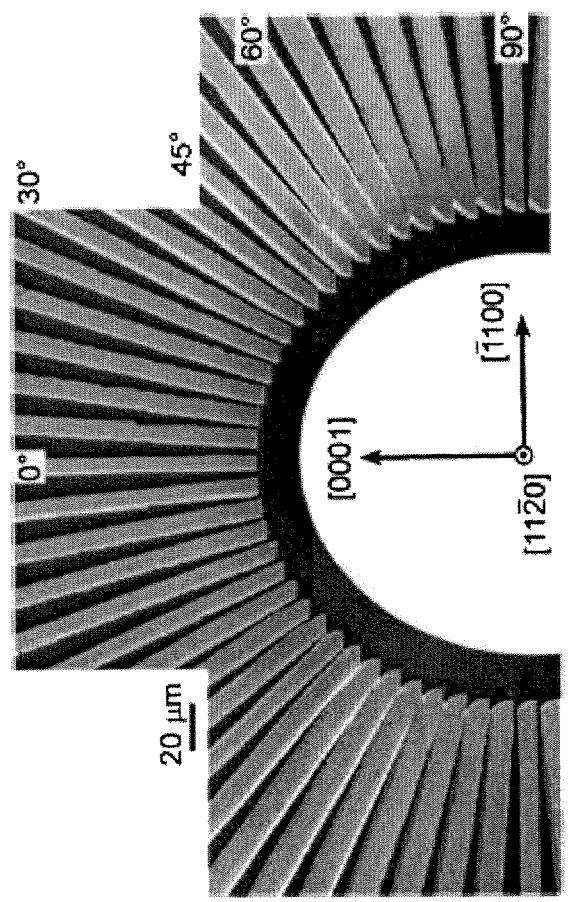
FIG. 2 is a plan-view scanning electron microscopy (SEM) image montage showing half of an a-GaN LEO wagon wheel pattern.

FIG. 2 is a plan-view scanning electron microscopy (SEM) image montage showing half of an a-GaN LEO wagon wheel pattern. The angles are included to facilitate reference to the wagon wheel pattern where 0° corresponds to the GaN c-axis [0001]. The reduced symmetry of the a-GaN surface (with respect to the c-GaN surface) is apparent in the stripe orientation dependence shown in FIG. 2, which is a 180° view of a single wagon wheel pattern. Primarily, this plan-view SEM image shows that lateral overgrowth occurred for all possible stripe orientations. Upon closer inspection, three stripe orientations had uniform morphologies without faceted sidewalls: parallel to [0001], 45° off, and perpendicular to the GaN c-axis (stripes parallel to the [$\bar{1}$100] direction). The stripes oriented 45° off the c-axis are indexed as [$\bar{1}$101] stripes since this crystallographic direction makes a 46.8° angle with the c-axis. FIG. 2 shows that as the stripe orientation changed from [0001] to [$\bar{1}$100], the stripe width increased until a maximum width was reached for stripes aligned 70° off the c-axis. After reaching this maximum, the stripe width decreased until it reached [$\bar{1}$100]. Note that specific crystallographic indexing is consistently used throughout this description due to the reduced symmetry of this film/substrate system in comparison to c-GaN.

Figure 3:
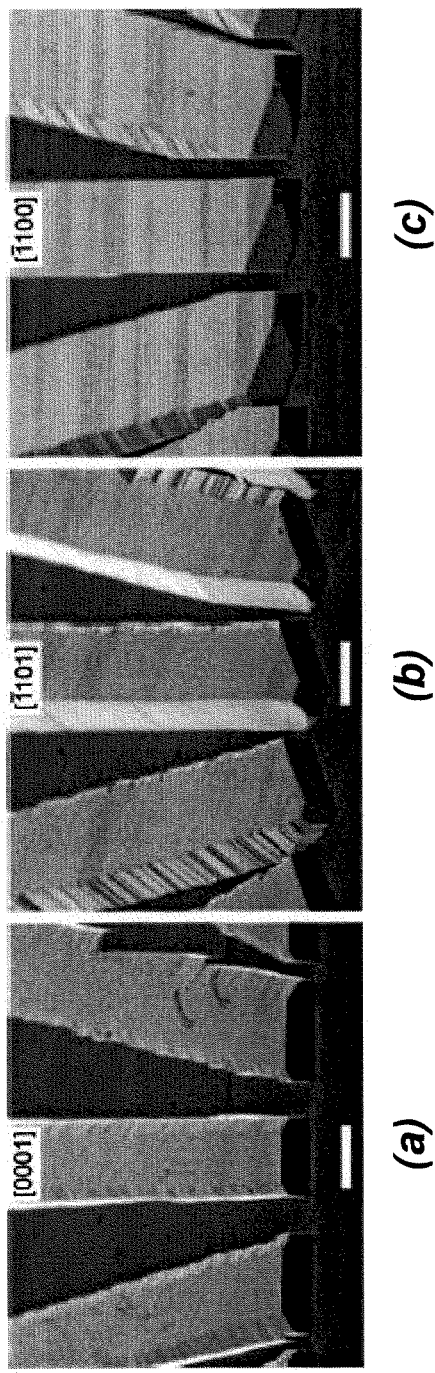
FIGS. 3(a), (b) and (c) are a series of SEM images with inclined views of the three stripes oriented parallel to [0001], [$\bar{1}$101], and [$\bar{1}$100], respectively.

An additional perspective is required to clearly observe the effects of stripe orientation on a-GaN LEO morphology. FIGS. 3(a), (b) and (c) are a series of SEM images with inclined views of the three stripes oriented parallel to [0001], [$\bar{1}$100], and [$\bar{1}$100], respectively, wherein the images correspond to the 0°, 45°, and 90° orientation labeling in FIG. 2 (and having a scale bar representing 55 μm).

For the growth conditions employed, [0001] and [$\bar{1}$101] stripes had various combinations of inclined and vertical sidewalls. Specifically, symmetric morphologies were observed for the [0001] stripes, while the [$\bar{1}$101] stripes had asymmetric morphologies with one microfaceted vertical (1$\bar{1}$02) sidewall and one inclined (1$\bar{1}$02) sidewall. The [0001] stripes had coexisting vertical and inclined facets from the same crystallographic family of {10$\bar{1}$0} planes. Conversely, [$\bar{1}$100] stripes had rectangular cross-sections with vertical (0001) basal plane sidewalls. Overall, [0001] and [$\bar{1}$100] stripe orientations yielded uniform, symmetric morphologies.

Figure 4:
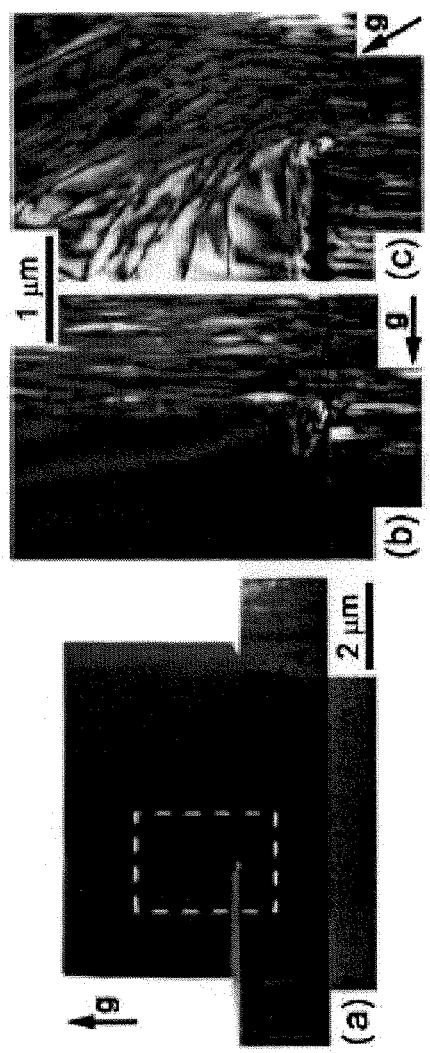
FIGS. 4(a), (b) and (c) are cross-sectional TEM images of a [$\bar{1}$100] stripe.

FIGS. 4(a), (b) and (c) are cross-sectional TEM images of a [$\bar{1}$100] stripe, wherein FIG. 4(a) shows threading dislocation reduction in the asymmetric overgrowth regions. Magnified views of the mask edge region defined by the dashed box in FIG. 4(a) are shown for FIG. 4(b) [$\bar{1}$100] and FIG. 4(c) [0001] stripes. The dislocation lines bend from the window region into the overgrowth region for stripes aligned along [0001], while no dislocation bending is observed for [$\bar{1}$100] stripes. FIG. 4(a), (b) and (c) are bright-field images with various diffraction conditions: FIG. 4(a) g=11$\bar{2}$0, FIG. 4(b) g=0006, and FIG. 4(c) g=01$\bar{1}$0. Although the stripes imaged are from a parallel stripe pattern (and not a wagon wheel pattern), similar morphologies were observed regardless of the mask stripe pattern.

Threading dislocation (TD) reduction was observed for LEO stripes aligned along [$\bar{1}$100], as shown in the cross-section TEM image in FIG. 4(a). Mask blocking is the primary dislocation reduction mechanism since no dislocations were observed to bend in the direction of the lateral overgrowth, as shown in FIG. 4(b). Unlike [$\bar{1}$100] stripes, FIG. 4(c) shows that dislocations propagated into the overgrown regions of stripes aligned along [0001]. Although the precise origin of this dislocation bending is not yet known, the stability of inclined facets for the [0001] stripe orientation might play a key role.

In addition to TD reduction, FIG. 4(a) reveals an asymmetry in lateral overgrowth rates for [$\bar{1}$100] stripes. The existence of polar c-plane sidewalls explains this asymmetry. With the polar axis perpendicular to the stripe direction, one sidewall is the +c plane or Ga-face while the opposing sidewall is the −c plane or N-face. As expected, the Ga-face sidewall grew faster than the N-face sidewall by a factor of ~10 depending on the growth conditions. Note that the polarity of a-GaN on r-sapphire was previously determined using convergent beam electron diffraction measurements. See Reference 13. Since polarity had such a significant effect on the lateral overgrowth of the [$\bar{1}$100] stripes, the asymmetric morphologies observed in FIGS. 2 and 3 may be related to the low symmetry of the structure.

Figure 5:
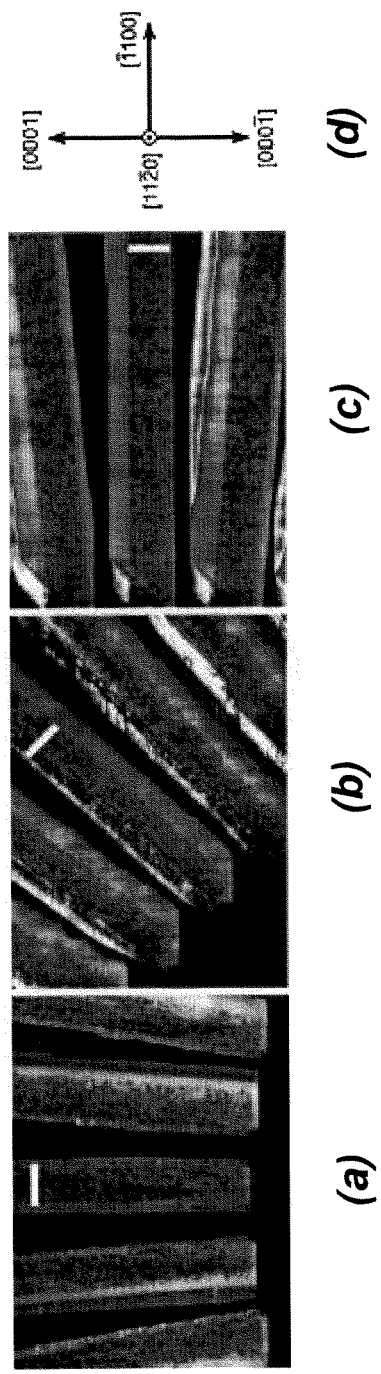

Additional evidence of the lateral overgrowth asymmetry for polar GaN was supplied by plan-view panchromatic CL images of [0001], [$\bar{1}$101], and [$\bar{1}$100] LEO stripes. FIGS. 5(a), (b) and (c) are plan-view panchromatic CL images of stripes oriented parallel to [0001], [$\bar{1}$101], and [$\bar{1}$100], while FIG. 5(d) illustrates the crystallographic orientation for FIGS. 5(a), (b) and (c). The CL images shown in FIGS. 5(a)-(c) directly correspond to the stripes imaged by SEM in FIGS. 3(a), (b) and (c) (and having a scale bar representing 55 μm). The mottled regions within each stripe orientation define the windows in the SiO$_2$ mask where TDs have extended unimpeded to the top surface of the LEO stripe. This CL characteristic has been observed in polar GaN LEO stripes. See References 16-18. The mottled area extends across the entire width of the [0001] stripe, which corresponds to the TEM observation of dislocation bending into the laterally overgrown regions for this stripe orientation. Even though the [0001] stripe shown in FIG. 5(a)-(c) had little lateral overgrowth, CL measurements of wider stripes grown under similar conditions confirmed the dislocation bending observed in FIG. 4(c). The uniform luminescence from the overgrown regions of [$\bar{1}$100] stripes confirms that those areas are relatively free of TDs. The effects of polarity on the lateral overgrowth rates of [$\bar{1}$100] stripes are also clearly observed.

In summary, LEO of non-polar (11$\bar{2}$0) a-plane GaN films was demonstrated and TD density reduction was achieved. The low symmetry a-GaN surface exhibited LEO stripe morphologies that were dependent on crystallographic stripe alignment. Two primary orientations, [0001] and [$\bar{1}$100], were observed to possess uniform, symmetric stripe morphologies; [$\bar{1}$100] stripes had vertical sidewalls while [0001] stripes had coexisting vertical and inclined sidewalls. Dislocation reduction was achieved in [$\bar{1}$100] stripes while dislocations propagated into the laterally overgrown regions of [0001] stripes. Between the [0001] and [$\bar{1}$100] orientations, asymmetric stripe morphologies were observed. Except for [0001] stripes, which had a non-polar lateral growth direction, all stripes exhibited asymmetric lateral growth rates. Ongoing investigations continue to explore the unique structural features of non-polar GaN LEO.

REFERENCES

The following references are incorporated by reference herein:
1. I. P. Smorchkova, C. R. Elsass, J. P. Ibbetson, R. Vetury, B. Heying, P. Fini, E. Haus, S. P. DenBaars, J. S. Speck, and U. K. Mishra, J. Appl. Phys. 86, 4520 (1999).
2. O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, J. Appl. Phys. 85, 3222 (1999).
3. I. J. Seo, H. Kollmer, J. Off, A. Sohmer, F. Scholz, and A. Hangleiter, Phys. Rev. B 57, R9435 (1998).
4. R. Langer, J. Simon, V. Ortiz, N. T. Pelekanos, A. Barski, R. Andre, and M. Godlewski, Appl. Phys. Lett. 74, 3827 (1999).
5. P. Lefebvre, J. Allegre, B. Gil, H. Mathieu, N. Grandjean, M. Leroux, J. Massies, and P. Bigenwald, Phys. Rev. B 59, 15363 (1999).
6. P. Lefebvre, A. Morel, M. Gallart, T. Taliercio, J. Allegre, B. Gil, H. Mathieu, B. Damilano, N. Grandjean, and J. Massies, Appl. Phys. Lett. 78, 1252 (2001).
7. T. Takeuchi, C. Wetzel, S. Yamaguchi, H. Sakai, H. Amano, I. Akasaki, Y. Kaneko, S. Nakagawa, Y. Yamaoka, and N. Yamada, Appl. Phys. Lett. 73, 1691 (1998).
8. T. S. Zheleva, N. Ok-Hyun, M. D. Bremser, and R. F. Davis, Appl. Phys. Lett. 71, 2472 (1997).
9. N. Ok-Hyun, M. D. Bremser, T. S. Zheleva, and R. F. Davis, Appl. Phys. Lett. 71, 2638 (1997).
10. H. Marchand, J. P. Ibbetson, P. T. Fini, P. Kozodoy, S. Keller, S. DenBaars, J. S. Speck, and U. K. Mishra, MRS Internet J. Nitride Semicond. Res. 3, 3 (1998).
11. H. Marchand, X. H. Wu, J. P. Ibbetson, P. T. Fini, P. Kozodoy, S. Keller, J. S. Speck, S. P. DenBaars, and U. K. Mishra, Appl. Phys. Lett. 73, 747 (1998).
12. S. Nakamura, M. Senoh, S. I. Nagahama, T. Matsushita, K. Kiyoku, Y. Sugimoto, T. Kozaki, H. Umemoto, M. Sano, and T. Mukai, Jpn. J. Appl. Phys., Part 2 38, L226 (1999).
13. M. D. Craven, S. H. Lim, F. Wu, J. S. Speck, and S. P. DenBaars, Appl. Phys. Lett. 81, 469 (2002).
14. D. Kapolnek, S. Keller, R. Vetury, R. D. Underwood, P. Kozodoy, S. P. DenBaars, and U. K. Mishra, Appl. Phys. Lett. 71, 1204 (1997).
15. J. Park, P. A. Grudowski, C. J. Eiting, and R. D. Dupuis, Appl. Phys. Lett. 73, 333 (1998).
16. S. J. Rosner, G. Girolami, H. Marchand, P. T. Fini, J. P. Ibbetson, L. Zhao, S. Keller, U. K. Mishra, S. P. DenBaars, and J. S. Speck, Appl. Phys. Lett. 74, 2035 (1999).
17. J. A. Freitas, Jr., N. Ok-Hyun, R. F. Davis, G. V. Saparin, and S. K. Obyden, Appl. Phys. Lett. 72, 2990 (1998).
18. Z. Yu, M. A. L. Johnson, J. D. Brown, N. A. El-Masry, J. F. Muth, J. W. Cook, Jr., J. F. Schetzina, K. W. Haberern, H. S. Kong, and J. A. Edmond, MRS Internet J. Nitride Semicond. Res. 4S1, G4.3 (1999).
19. T. S. Zheleva, S. A. Smith, D. B. Thomson, T. Gehrke, K. J. Linthicum, P. Rajagopal, E. Carlson, W. M. Ashmawi, and R. F. Davis, MRS Internet Journal of Nitride Semiconductor Research 4S1 (1999).

CONCLUSION

This concludes the description of the preferred embodiment of the present invention. The following describes some alternative embodiments for accomplishing the present invention.

The crucial aspects of lateral overgrowth techniques are the dielectric mask specifications and the MOCVD regrowth conditions. A variety of dielectric materials, deposition techniques, and patterning methods can be employed to fabricate effective masks for lateral overgrowth. In addition, modifying the orientation, design, and dimensions of the mask pattern will ultimately determine the characteristics of the subsequent lateral overgrowth. Sufficient control of the lateral overgrowth is required in order to achieve dislocation reduction and to completely overgrow the mask such that a planar film is re-formed. The specific details of the lateral overgrowth, including lateral-to-vertical growth rate ratio and sidewall facet stability, are controlled via the MOCVD regrowth conditions. MOCVD growth conditions are reactor dependent and may vary between specific reactor designs. Fundamental variations in conditions such as growth temperature, growth pressure, V/III ratio, precursor flows, and source materials are potential modifications of this invention.

In addition, the dislocation reduction can also be achieved using alternative overgrowth methods. For example, cantilever epitaxy, double lateral epitaxial overgrowth (LEO), and SiN nanomasking techniques could be used as alternatives to lateral epitaxial overgrowth.

Further, although non-polar a-plan GaN thin films are described in the experimental results section above, the same techniques are applicable to non-polar m-plane GaN thin films. Moreover, non-polar InN, AlN, and AlInGaN thin films could be used instead of GaN thin films.

Finally, substrates other than sapphire substrate could be employed for non-polar GaN growth. These substrates include silicon carbide, gallium nitride, silicon, zinc oxide, boron nitride, lithium aluminate, lithium niobate, germanium, aluminum nitride, and lithium gallate.

In summary, the present invention describes lateral epitaxial overgrowth of non-polar III-nitride seed layers which results in threading dislocation reduction. First, a thin patterned dielectric mask is applied to the seed layer. Second, a selective epitaxial regrowth is performed to achieve lateral overgrowth of the patterned mask. Upon regrowth, the III-nitride films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-nitride based device structure, comprising:
a Gallium Nitride (GaN) substrate;
a planar non-polar GaN film, grown on or above the GaN substrate, wherein the planar non-polar GaN film is own with a dislocation density of less than $1\times10^8$ cm$^{-2}$ and a stacking fault density less than $3.8\times10^5$ cm$^{-1}$; and
a non-polar InGaN-based light emitting diode or laser diode structure, comprising a quantum well structure, grown on a surface of the planar non-polar GaN film, wherein polarization-induced electric fields are eliminated in the non-polar InGaN-based light emitting diode or laser diode structure.

2. The device structure of claim 1, wherein the film is an a-plane film.

3. The device structure of claim 1, wherein the film is an m-plane film.

4. A method of fabricating a III-nitride-based device structure, comprising:
growing a planar non-polar Gallium Nitride (GaN) film on or above a GaN substrate, wherein the planar non-polar GaN film is grown with a dislocation density of less than $1\times10^8$ cm$^{-2}$ and a stacking fault density less than $3.8\times10^5$ cm$^{-1}$; and
growing a non-polar InGaN-based light emitting diode or laser diode structure, comprising a quantum well structure, on a surface of the planar non-polar GaN film, wherein polarization-induced electric fields are eliminated in the non-polar InGaN-based light emitting diode or laser diode structure.

5. The method of claim 4, wherein the film is an a-plane film.

6. The method of claim 4, wherein the film is an m-plane film.

7. The method of claim 4, further comprising:
(a) depositing a dielectric regrowth mask on a non-polar GaN layer on the GaN substrate;
(b) patterning the deposited mask; and
(c) performing a selective regrowth to achieve an overgrowth based on the patterned mask, wherein the overgrowth comprises the planar non-polar GaN film.

8. The method of claim 7, wherein the overgrowth comprises a lateral epitaxial overgrowth.

9. The method of claim 7, wherein the dislocations are reduced in the overgrowth by the mask blocking propagation of the dislocations vertically into the growing film.

10. The method of claim 7, wherein the dislocations are reduced in the overgrowth by bending of the dislocations through a transition from vertical to lateral growth.

11. The method of claim 4, wherein cathodoluminescence from the planar non-polar GaN film is uniform across the non-polar top surface.

12. The device of claim 1, wherein cathodoluminescence from the planar non-polar GaN film is uniform across the non-polar top surface.

* * * * *